United States Patent
Prasad et al.

(10) Patent No.: US 12,327,580 B2
(45) Date of Patent: Jun. 10, 2025

(54) REGISTER, FLOP, AND LATCH DESIGNS INLCUDING FERROELECTRIC AND LINEAR DIELECTRICS

(71) Applicant: Advanced Micro Devices, Inc., Santa Clara, CA (US)

(72) Inventors: Divya Madapusi Srinivas Prasad, Mountain View, CA (US); Michael Ignatowski, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 84 days.

(21) Appl. No.: 18/216,499

(22) Filed: Jun. 29, 2023

(65) Prior Publication Data

US 2024/0087631 A1    Mar. 14, 2024

Related U.S. Application Data

(60) Provisional application No. 63/405,343, filed on Sep. 9, 2022.

(51) Int. Cl.
*G11C 11/22*    (2006.01)
*G11C 19/00*    (2006.01)

(52) U.S. Cl.
CPC .......... *G11C 11/221* (2013.01); *G11C 19/005* (2013.01)

(58) Field of Classification Search
CPC . G11C 11/221; G11C 19/005; G11C 11/2273; G11C 11/2293; G11C 11/005; G11C 5/04
See application file for complete search history.

(56) References Cited

U.S. PATENT DOCUMENTS 11,303,280 B1 *    4/2022    Mathuriya .............. H01L 28/55

FOREIGN PATENT DOCUMENTS

JP    2000124776 A  *  4/2000

* cited by examiner

*Primary Examiner* — Jay W. Radke
(74) *Attorney, Agent, or Firm* — Patterson + Sheridan, LLP

(57) ABSTRACT

A memory device includes a memory circuitry includes a first transmission grate, a first capacitor, a second transmission gate, and a second capacitor. The first transmission gate includes a first transistor connected between a first node and a second node. The first transistor having a gate terminal connected to a first clock node. The first clock node configured to receive a first clock signal. The first capacitor is connected between the second node and a first voltage node. The first capacitor is a ferroelectric capacitor. The second transmission gate includes a second transistor connected between the second node and a third node. The second transistor has a gate terminal connected to the first clock node. The second capacitor is connected between the third node and a second voltage node.

20 Claims, 8 Drawing Sheets

REGISTER, FLOP, AND LATCH DESIGNS INLCUDING FERROELECTRIC AND LINEAR DIELECTRICS

CROSS REFERENCE TO RELATED APPLICATION

This application claims priority to the U.S. Provisional Patent Application No. 63/405,343, filed on Sep. 9, 2022 of which is incorporated herein by reference in its entirety.

TECHNICAL FIELD

Examples of the present disclosure generally relate to registers that include ferroelectric capacitors.

BACKGROUND

Non-volatile memories such as ferroelectric based memories (e.g., ferroelectric random-access memories (FeRAMs) or ferroelectric field-effect transistor (FeFET) memories, among others), magnetoresistive RAMs (MRAMs), and volatile memories such as dynamic random access memories (DRAMs), including high bandwidth memory (HBM) and other stacked variants of DRAM, provide higher memory density, performance, and lower power than other types of memories.

DRAMs are a commonly used as off-chip memory. However, DRAM has Performance-Power-Area (PPA) limitations relating to accessing data with an external integrated circuit (IC) chip (e.g., off-chip). The typical DRAM bitcell consists of a one transistor and one capacitor (1T-1C) structure, wherein the capacitor is formed by a dielectric layer sandwiched in between conductor plates. System Instruction-per-cycle (IPC) and/or system performance is often limited by DRAM bandwidth and latency, especially in memory-heavy workloads.

HBM has been introduced to provide increased bandwidth and memory density, allowing up to 8-12 layers of DRAM dies to be stacked on top of each other with an optional logic/memory interface die.

A FeRAM memory bitcell is similar to the 1T-1C structure DRAM, except for the capacitor that is made of a ferroelectric material versus a (linear) dielectric in the DRAM case. Bit '0' and '1' are written with electric polarization orientations of the ferroelectric material in the dielectric. The benefit of this technology is a refresh-free storage that increases the density and performance as compared to a DRAM. MRAM bitcell has a 1T-1R (one transistor, one resistor) configuration that does not have a destructive read, unlike DRAM and FeRAM. However, MRAM is less reliable as compared to FeRAM, and other ferroelectric based memories, and has lower endurance and retention.

A memory technology may be developed using as an independent macro or for specific applications like deep neural networks (DNN), in the HBM case. In some examples, graphics processing DDR (GPDDR) is used to support high-bandwidth memory for graphics applications. More fine-grained optimizations of memory technology with logic technology and architecture are not deeply explored, accordingly, further work is to be done to achieve superior performance and lower power products. Non-linear power increase and/or decreasing improvement in performance and memory density from generation to generation uses more design and co-optimization to alleviate memory bottlenecks.

SUMMARY

In the following, registers and latches, which include capacitors formed with ferroelectric material are described. The ferroelectric material increases the radiation hardness and reduces current leakage of the registers. Further, registers and latches which include ferroelectric material may operate with reduced refreshes (or refresh free) as compared to other dynamic memories. According, the registers and latches described herein provide higher performance, lower power and area over classical on-chip registers.

In one example, a memory circuitry includes a first transmission grate, a first capacitor, a second transmission gate, and a second capacitor. The first transmission gate includes a first transistor connected between a first node and a second node. The first transistor having a gate terminal connected to a first clock node. The first clock node configured to receive a first clock signal. The first capacitor is connected between the second node and a first voltage node. The first capacitor is a ferroelectric capacitor. The second transmission gate includes a second transistor connected between the second node and a third node. The second transistor has a gate terminal connected to the first clock node. The second capacitor is connected between the third node and a second voltage node.

In one example, an integrated circuit chip includes memory circuitry and memory controller circuitry. The memory circuitry includes a plurality of registers. A first register of the plurality of registers includes a first transmission gate, a first capacitor, a second transmission gate, and a second capacitor. The first transmission gate includes a first transistor connected between a first node and a second node. The first transistor having a gate terminal connected to a first clock node. The first clock node configured to receive a first clock signal. The first capacitor is connected between the second node and a first voltage node. The first capacitor is a ferroelectric capacitor. The second transmission gate includes a second transistor connected between the second node and a third node. The second transistor having a gate terminal connected to the first clock node. The second capacitor is connected between the third node and a second voltage node. The memory controller circuitry is coupled to the memory circuitry. The memory controller circuitry at least one of drives a first signal onto the first node to update the first register and receives a second signal from the third node to read a value of the first register.

In one example, a memory circuitry includes a first transmission gate, a second transmission gate, a third transmission gate, a first capacitor, a second capacitor, and a third capacitor. The first transmission gate is connected between a first node and a second node, and receives a first clock signal. The second transmission gate is connected between the second node and a third node, and receives the first clock signal. The third transmission gate is connected between the third node and a fourth node, and receives the first clock signal. The first capacitor is connected between the second node and a first voltage node. The second capacitor is connected between the third node and a second voltage node. The third capacitor is connected between the fourth node and a third voltage node.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
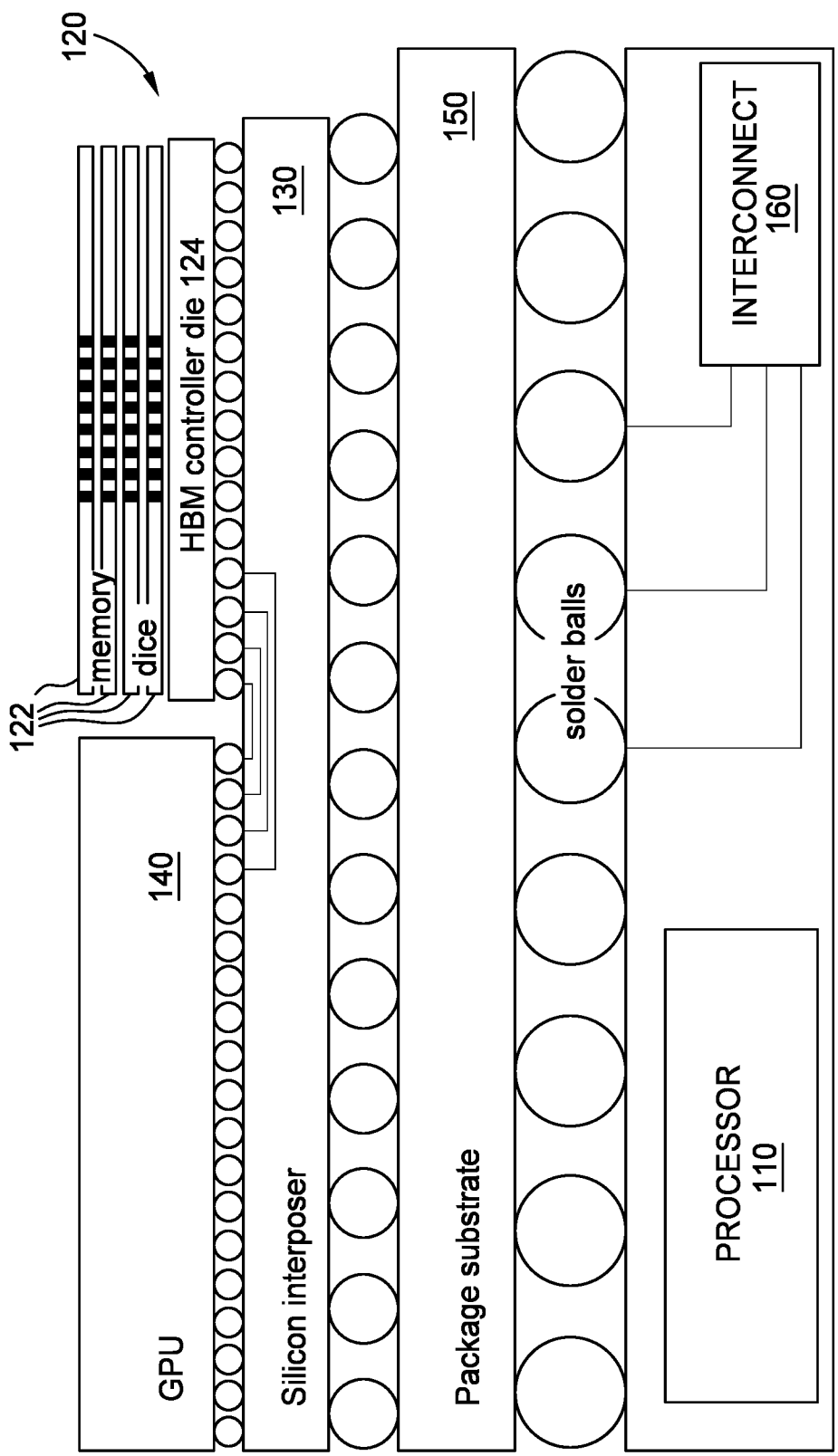
FIG. 1 illustrates a block diagram of a memory, according to some examples.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the features or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Processing devices (e.g., central processing units (CPUs), and graphics processing units (GPUs), and/or Process-In-Memory (PIM) devices, among others) use registers to improve data processing. Registers may be used to store instructions, storage addresses, and/or data (e.g., bit sequences or individual characters) for processing. The registers may be included within dynamic random-access memory (DRAM) and ferroelectric RAM (FeRAM) based advanced memories of processing device.

Memory devices may be "off-chip" memory devices. An off-chip memory device differs from an embedded memory device in that an off-chip is disposed in a different chip (e.g., integrated circuit (IC) die) than the chip of the processor (e.g., processor IC die). An off-chip memory device is typically has a larger storage size than an embedded memory device. However, an off-chip memory device has an increased latency as compared to embedded memory, increasing memory read and write times and decreasing processor performance.

A DRAM is a commonly used off-chip memory. However, DRAM has Performance-Power-Area (PPA) limitations that are related to accessing data in an off-chip memory. High bandwidth memory (HBM) provides increased bandwidth and memory density by allowing up to 8-12 layers of DRAM (or other memory devices) dies (chips) to be stacked on top of each other with an optional logic/memory interface die. As illustrated in FIG. 1, the memory stack 120 is either be connected to the processor 140 through the silicon interposer 130 or disposed on top of the processor 110 to provide superior connectivity and performance. In one example, the memory stack 120 is connected to the processor 110 and the interconnects 150 via the silicon interposer 130 and package substrate 160. The processors may be a central processing unit (CPU) or a graphics processing unit (GPU), among others. The memory stack 120 may include a memory controller die 124 and one or more memory dies 122. The memory dies 122 are interconnected and stacked on and connected to the memory controller die 124.

In the following, registers for a memory device is described. The registers as described herein allow for an a memory device having an increased memory density and bandwidth as compared to other types of memories with minimal impact to power and performance to mitigate the memory-bottleneck to overall system performance. A register includes one or more flip-flops. In one or more examples, the flip-flops forming the registers are disposed on an integrated circuit (IC) die (chip) of the corresponding processing device. The registers are controlled via memory controller circuitry, and/or other control circuitry. The flip-flops are high-speed master-slave/lead-follow flip-flops that improve the performance, power, and/or area of the corresponding IC chip and/or processing system.

A flip-flop may be a delay flip-flop (or D flip-flop). In one or more examples, a flip-flop includes at least 30 transistors. Accordingly, registers formed from flip-flips account for a large percentage of the total circuit area of the corresponding processing device, and/or power usage within the processing device, increasing the manufacturing cost of the corresponding processing device.

A register design for a broad set of applications is described in the following. GPUs could benefit from low leakage low area flip-flops as described in the following. PIM architectures could benefit from FeRAM based local registers for low leakage and area for improving memory array area usage or increasing processing functions in memory device. Further, CPUs benefit from registers described in the following, as the registers can achieve logic-transistor based register performance. The register configuration as described in the following may be implemented to improve internet of things (IoT), wearable devices, and/or low power client devices, as such devices can tolerate discontinuous power supply and resume state easily.

The registers as described in the following are nonvolatile, radiation hardened, and/or low-power registers on a logic chip or die. In one or more examples, at least 30% of the die area in a GPU can be occupied by flip-flops. Further, the flip-flops also account for a big percentage of dynamic and static power in a system-on-chip (SoC) as the flip-flops switch at every clock cycle of a clock signal.

In one or more examples, if a power outage occurs, data in the registers is lost and charge-based storage is susceptible to soft errors. Since FeRAM is logic compatible and can function with a lower supply voltage value than other non-volatile memory (NVM) types, FeRAM devices can be integrated on the same die as logic transistors. In one example, a FeRAM flip-flop is modified to function in a small-area, low-power, reasonably performant flip-flop (e.g., D flip-flop) with radiation hardened behavior and non-volatility. The registers described in the following are logic-compatible flip-flops (or register files) that backup to a non-volatile memory (NVM), which is lower in the memory hierarchy pyramid.

The registers as describe in the following provide increased memory density and bandwidth, with minimal impact to power and performance to alleviate the memory-bottleneck to system performance.

Figure 2:
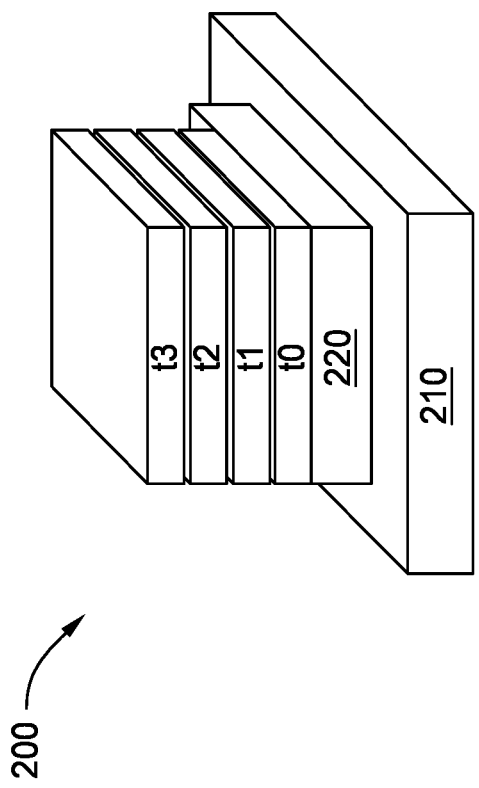
FIG. 2 illustrates a block diagram of a memory stackup, according to some examples.

FIG. 2 illustrates a memory system 200, according to one or more examples. The memory system 200 includes a stack-up of one or more memory chips (t0-t3) disposed on a processor chip 210. The memory chips t0-t3 are DRAM (or other types of RAM). In one example, the stack-up of memory chips t0-t3 forms a HBM. The processor chip 210 is a CPU, a GPU, or a field programmable gate array (FPGA), among others, with a memory-interface die. The example of FIG. 2 includes a DRAM stack stacked on top of the processor chip 210 with a memory controller (e.g., memory interface) IC chip 220. The memory chips t0-t3 are connected to each other via through silicon-vias (TSVs) and/or hybrid bonds, among others.

Figure 3:
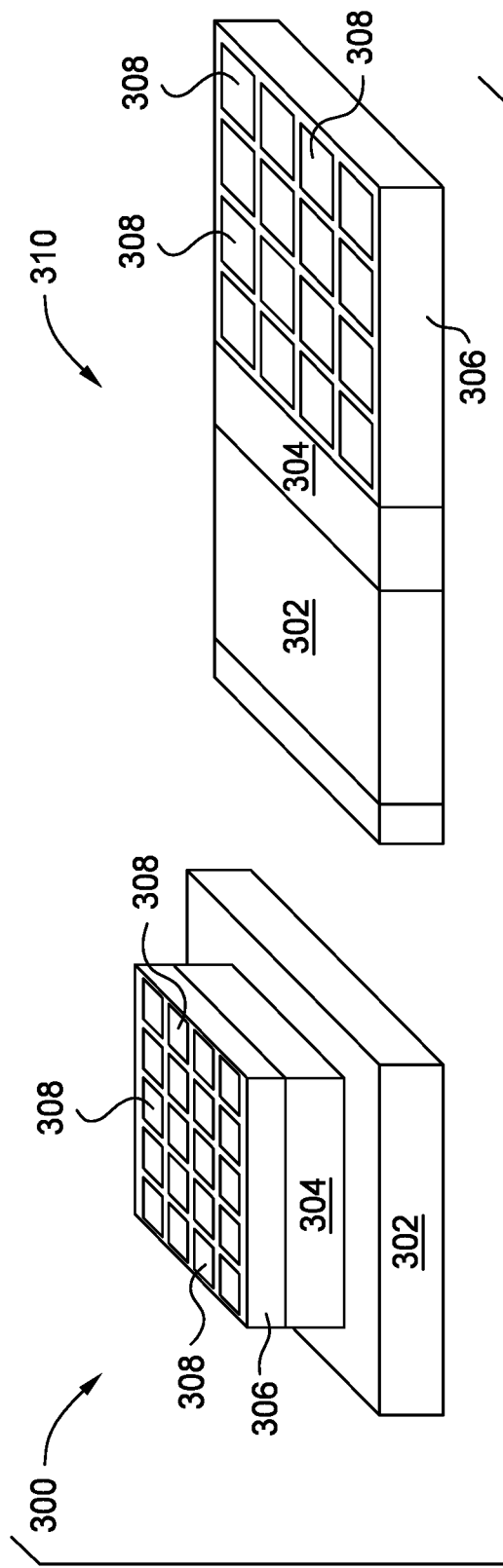
FIG. 3 illustrates a block diagram of different memory stackups, according to some examples.

FIG. 3 illustrates an IC device 300 with a ferroelectric based memory (e.g., FeRAM and FeFET memory, among others) 306 and memory controller circuitry are stacked on-top of the processor IC chip 302. In the IC device 310, the ferroelectric based memory 306 and a memory controller circuitry 304 are disposed on the same die as the processor IC chip 302. The memory 306 may be disposed within a first IC chip and the memory controller is disposed in a second IC chip. In the IC device 300, a ferroelectric based memory 306 is stacked on top of the processor IC chip 302 with a memory-interface. In the IC device 310, the ferroelectric based memory 306 is included in the same die as the processor IC chip 302 as the ferroelectric based memory 306 is logic-technology compatible with the processor IC chip 302. In one example, the memory 306 may be disposed within a first IC chip and the memory controller circuitry 304 is disposed in a second IC chip. Further, the processor IC chip 302 is separate from the IC chip of the memory 306 and the IC chip of the memory controller circuitry 304.

In one or more examples, the memory 306 of the IC device 300 and/or the IC device 310 includes one or more registers 308. Each of the registers 308 includes one or more flip-flops. The flip-flops of the registers 308 may be configured similar to that as described with regard to the flip-flops 410, 420, 430, and 440 of FIGS. 4A-4D. In one example, the registers 308 are connected to the memory controller circuitry 304 via control lines (e.g., wordlines and/or bitlines, among others). The control lines are used to select a register 308 or registers 308 for updating and the bitlines are used to drive a voltage onto or read a voltage from the selected register 308. The read out voltages are provided to the processor IC chip 302. In one example, the memory controller circuitry 304 drives a clock signal and an inverted clock signal to the registers 308.

FIGS. 4A-4D illustrate examples of flip-flops 410, 420, 430, and 440. The flip-flops 410, 420, 430, and 440 are D flip-flops. The flip-flop 410 includes transmission gates (413 and 414, and capacitors 411 and 412. The flip-flop 420 includes transmission gates 423 and 424, and capacitors 421 and 422. The flip-flop 430 includes transmission gates 433 and 434, and capacitors 431 and 432. The flip-flop 440 includes transmission gates 444, 445, and 446, and capacitors 441, 442, and 443. One or more of the capacitors 411 and 412 are ferroelectric capacitors. One or more of the capacitors 421 and 422 are ferroelectric capacitors. One or more of the capacitors 431 and 432 are ferroelectric capacitors. One or more of the capacitors 441, 442, and 443 are ferroelectric capacitors. Further, one or more of the flip-flops 410, 420, 430, and 440 are for a register (e.g., the register 308). The register may be referred to as a Fe RAM bitcell. In one example, two or more flip-flops (e.g., the flip-flops 410, 420, 430, and 440) are used to form a register. In one example, a transmission gate may also be referred to as gate circuitry. The transmission gates 413 and 414 are a first and second stage, respectively, of the flip-flop 410.

Figure 4A:
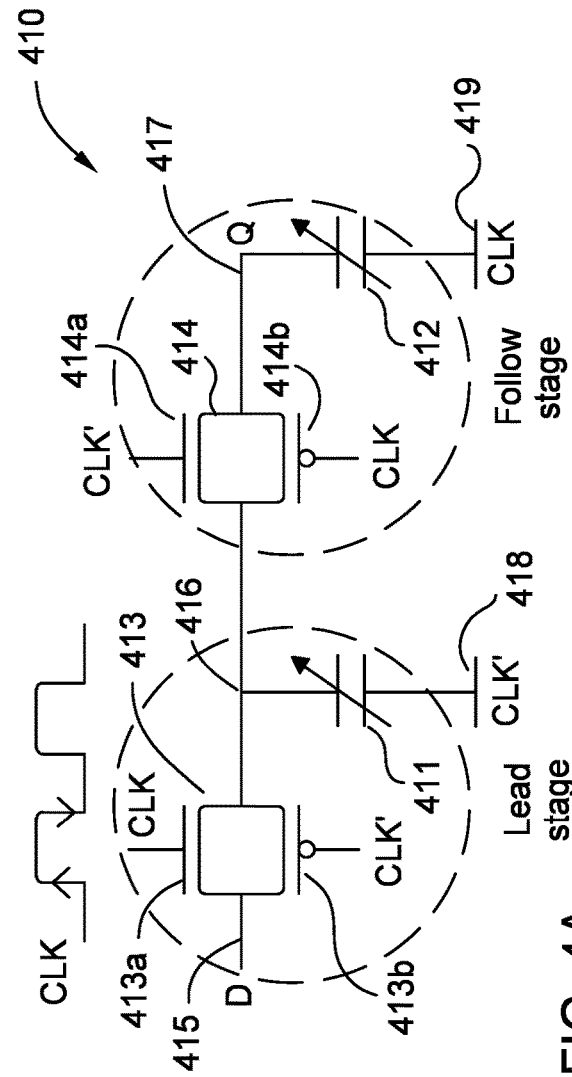
FIGS. 4A, 4B, 4C, and 4D illustrate circuit diagrams having different flip-flop configurations, according to some examples.
Figure 4B:
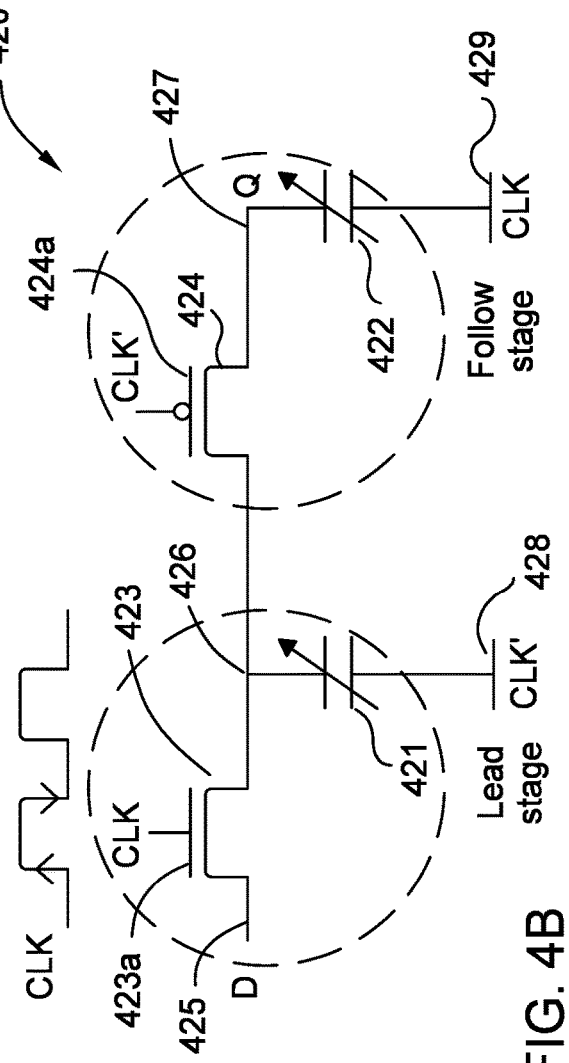
Figure 4C:
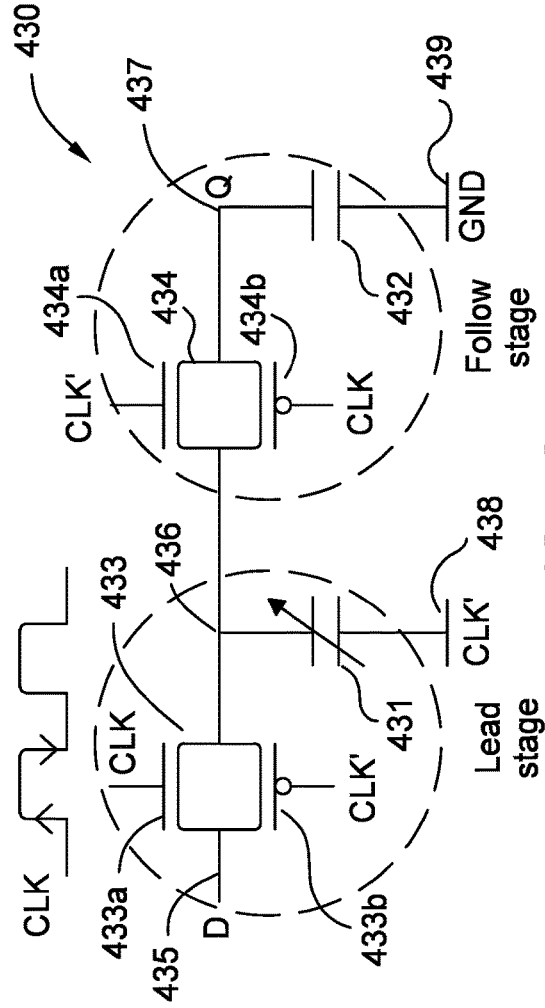
Figure 4D:
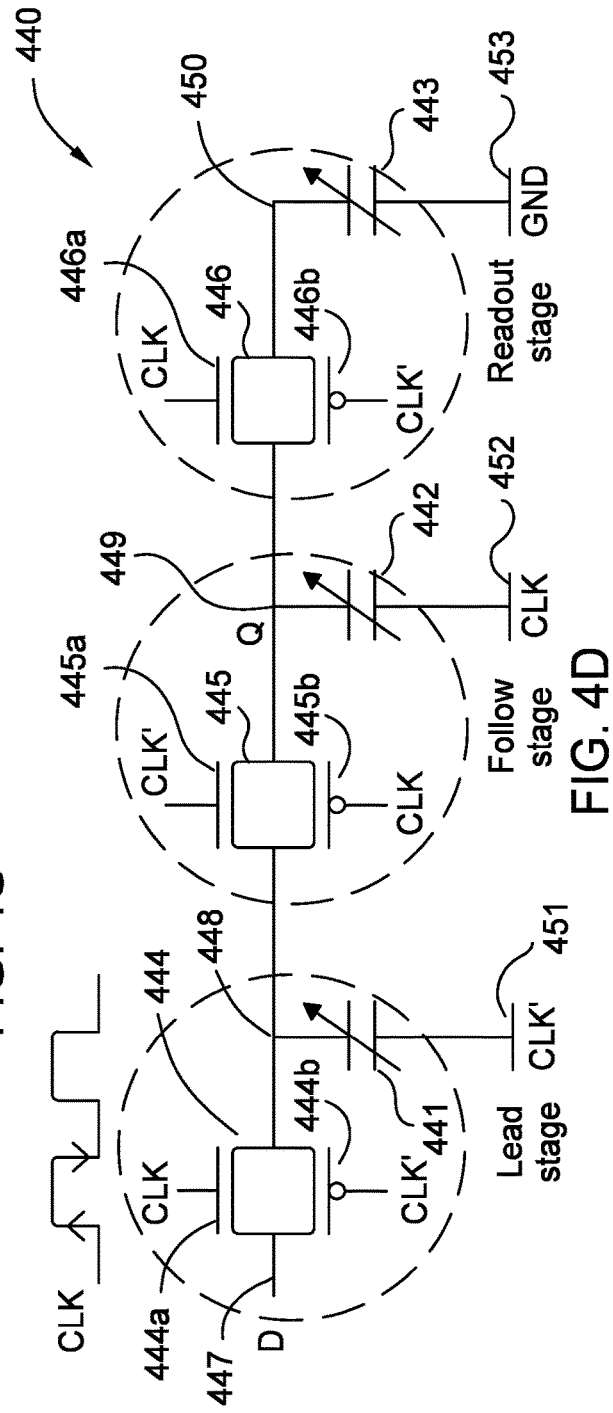

In FIGS. 4A-4C, the flip-flops 410, 420, and 430 are lead-follow two stage delay flip-flops with ferroelectric capacitors (e.g., capacitors 411 and 412, capacitors 421 and 422, and capacitor 431). In FIG. 4A, the transmission gates 413 and 414 are each formed from two transistors disposed in parallel with each other. For example, the transmission gate 413 includes transistors 413a and 413b and the transmission gate 414 includes transistors 414a and 414b.

The flip-flop 410 includes the transmission gate 413 and the transmission gate 414. The transmission gate 413 is connected between the node 415 and the node 416. The transmission gate 414 is connected between the node 416 and the node 417. The node 415 may be referred to as an input node, or the data input of the flip-flop 410. The node 417 may be referred to as an output node. The capacitor 411 is connected between the node 416 and a voltage node (or clock node) 418 that receives an inverted clock signal (CLK'), and the capacitor 412 is connected between the node 417 and a voltage node (or clock node) 419 that receives the clock signal (CLK). The capacitors 411 and 412 are ferroelectric capacitors. The transmission gate 413 and the transmission gate 414 receive the clock signal CLK and the inverted clock signal CLK'.

The transmission gate 413 includes transistors 413a and 413b. The transmission gate 414 includes transistors 414a and 414b. The transistor 413a is an NMOS (n-type metal-oxide semiconductor) transistor. The transistor 413a includes a gate terminal connected to the node that receives the clock signal CLK, a drain node connected to the node 415, and a source node connected to the node 416. The transistor 413b is a PMOS (P-type metal-oxide semiconductor) transistor. The transistor 413b includes a gate terminal connected to the node that receives the inverted clock signal CLK', a source node connected to the node 415, and a drain node connected to the node 416.

The transistor 414a is an NMOS transistor. The transistor 414a includes a gate terminal connected to the node that receives the inverted clock signal CLK', a drain node connected to the node 416, and a source node connected to the node 417. The transistor 414b is a PMOS transistor. The transistor 414b includes a gate terminal connected to the node that receives the clock signal CLK, a source node connected to the node 416, and a drain node connected to the node 417.

The transmission gate 413 and the capacitor 411 form a lead stage of the flip-flop 410, and the transmission gate 414 and the capacitor 412 form a follow stage of the flip-flop 410.

The flip-flop 420 is configured similar to the flip-flop 410. The flip-flop 420 includes the transmission gate 423 and the transmission gate 424. The transmission gate 423 is connected between the node 426 (e.g., input node) and the node 426. The transmission gate 424 is connected between the node 426 and the node 427 (e.g., an output node). The transmission gate 423 includes the transistor 423a. The transistor 423a is an NMOS transistor. The transistor 423a includes a gate terminal connected to the node that receives the clock signal CLK, a drain node connected to the node 425, and a source node connected to the node 426. The transmission gate 424 includes the transistor 424a. The transistor 424a is an PMOS transistor. The transistor 424a includes a gate terminal connected to the node that receives the clock signal CLK, a drain node connected to the node 426, and a source node connected to the node 427. The node 425 may be referred to as an input node, or the data input of the flip-flop 420. The node 427 may be referred to as an output node of the flip-flop 420. The transmission gates 423 and 424 are a first and second stage, respectively, of the flip-flop 420.

The capacitor 421 is connected between the node 426 and the node 428 that receives the inverted clock signal CLK' (e.g., a clock signal node). The capacitor 422 is connected between the node 427 and the node 429 that receives the clock signal CLK (e.g., a clock signal node). The transmission gate 423 and the capacitor 421 form the lead stage of the flip-flop 420. The transmission gate 424 and the capacitor 422 form the follow stage of the flip-flop 420.

The flip-flop 430 is configured similar to the flip-flop 410. As compared to the flip-flop 410, the flip-flop 430 includes the capacitor 432 that is not a ferroelectric capacitor. For example, the capacitor 432 is a regular linear dielectric capacitor.

The flip-flop 430 includes the transmission gate 433 and the transmission gate 434. The transmission gate 433 and the transmission gate 434 receive the clock signal (CLK) and the inverted clock signal (CLK'). The transmission gate 433 is connected between the node 435 and the node 436. The transmission gate 434 is connected between the node 436 and the node 437. The node 435 may be referred to as an input node, or the data input of the flip-flop 430. The node 437 may be referred to as an output node of the flip-flop 430. The capacitor 431 is connected between the node 436 and the voltage node 438 that receives the inverted clock signal (CLK'), and the capacitor 432 is connected between the node 437 and the voltage node 439 that receives the clock signal (CLK). The capacitor 431 is a ferroelectric capacitor and the capacitor 432 is a regular linear dielectric capacitor. The transmission gates 433 and 434 are a first and second stage, respectively, of the flip-flop 430.

The transmission gate 433 includes transistors 433a and 433b. The transmission gate 434 includes transistors 434a and 434b. The transistor 433a is an NMOS transistor. The transistor 433a includes a gate terminal connected to the node that receives the clock signal (CLK), a drain node connected to the node 435, and a source node connected to the node 436. The transistor 433b is a PMOS transistor. The transistor 433b includes a gate terminal connected to the node that receives the inverted clock signal (CLK'), a source node connected to the node 435, and a drain node connected to the node 436.

The transistor 434a is an NMOS transistor. The transistor 434a includes a gate terminal connected to the node that receives the inverted clock signal (CLK'), a drain node connected to the node 436, and a source node connected to the node 437. The transistor 434b is a PMOS transistor. The transistor 434b includes a gate terminal connected to the node that receives the clock signal (CLK), a source node connected to the node 436, and a drain node connected to the node 437.

The capacitor 431 is connected between the node 436 and the node 438 that receives the inverted clock signal (CLK'). The capacitor 432 is connected between the node 437 and the node 439 that receives a reference voltage (e.g., a ground voltage or other system voltage). The transmission gate 433 and the capacitor 431 form a lead stage of the flip-flop 430, and the transmission gate 434 and the capacitor 432 form a follow stage of the flip-flop 430.

The flip-flop 440 is configured similar to the flip-flop 410. As compared to the flip-flop 410, the flip-flop 440 includes a readout stage that includes a third transmission gate (e.g., the transmission gate 446) and the capacitor 443. The transmission gate 446 is connected between the node 449 and the node 450, and is configured similar to the transmission gate 444.

The flip-flop 440 includes the transmission gate 444, the transmission gate 445, and the transmission gate 446. The transmission gate 444 is connected between the node 447 and the node 448. The transmission gate 445 is connected between the node 448 and the node 449. The transmission gate 446 is connected between the node 449 and the node 450. The node 447 may be referred to as an input node, or the data input of the flip-flop 440. The node 450 may be referred to as an output node of the flip-flop 440.

The capacitor 441 is connected between the node 448 and a voltage node 451 that receives the inverted clock signal (CLK'). The capacitor 442 is connected between the node 449 and a voltage node 452 that receives the clock signal (CLK). The capacitor 443 is connected between the node 450 and a voltage node 453 that receives a reference voltage (or a ground voltage). The capacitor 441 is a ferroelectric capacitor. The capacitor 442 is one of a ferroelectric and a regular linear dielectric capacitor. The capacitor 443 is one of a ferroelectric and a regular linear dielectric capacitor.

Each of the transmission gate 444, the transmission gate 445, and the transmission gate 446 receive the clock signal (CLK) and the inverted clock signal (CLK'). The transmission gate 444 includes transistors 444a and 444b. The transmission gate 445 includes transistors 445a and 445b. The transmission gate 446 includes transistors 446a and 446b. The transmission gates 444, 445, and 446 are a first, second, and third stage, respectively, of the flip-flop 430.

The transistor 444a is an NMOS transistor. The transistor 444a includes a gate terminal connected to the node that receives the clock signal (CLK), a drain node connected to the node 447, and a source node connected to the node 448. The transistor 444b is a PMOS transistor. The transistor 444b includes a gate terminal connected to the node that receives the inverted clock signal (CLK'), a source node connected to the node 447, and a drain node connected to the node 448. The node 447 may be referred to as an input node.

The transistor 445a is an NMOS transistor. The transistor 445a includes a gate terminal connected to the node that receives the inverted clock signal (CLK'), a drain node connected to the node 448, and a source node connected to the node 449. The transistor 445b is a PMOS transistor. The transistor 445b includes a gate terminal connected to the node that receives the clock signal (CLK), a source node connected to the node 448, and a drain node connected to the node 449.

The transistor 446a is an NMOS transistor. The transistor 446a includes a gate terminal connected to the node that receives the inverted clock signal (CLK), a drain node connected to the node 449, and a source node connected to the node 450. The transistor 446b is a PMOS transistor. The transistor 446b includes a gate terminal connected to the node that receives the inverted clock signal (CLK'), a source node connected to the node 449, and a drain node connected to the node 450. The node 450 may be referred to as an output node.

The capacitor 441 is connected between the node 448 and the node 451 that receives the inverted clock signal (CLK').

The capacitor 442 is connected between the node 449 and the node 452 that receives the clock signal (CLK). The capacitor 443 is connected between the node 450 and a reference voltage node that receives a reference voltage (e.g., a ground voltage or other system voltage). The transmission gate 444 and the capacitor 441 form a lead stage of the flip-flop 440, the transmission gate 445 and the capacitor 442 form a follow stage of the flip-flop 440, and the transmission gate 446 and the capacitor 443 form a readout stage of the flip-flop 440.

In FIG. 4A, the transmission gates 413 and 414 improve the pull-up and pull-down range of the flip-flop 410. The flip-flop 410 is larger in circuit area compared to the flip-flop 420. In one or more examples, the flip-flops 410 and 420 can have metastability issues since each of the capacitors 412 and 422 (e.g., the output capacitors) is a ferroelectric capacitor that generates an instantaneous voltage/current as compared to holding the value for the rest of the clock period. In the flip-flop 430, the capacitor 432 is a non-ferroelectric (e.g., regular) capacitor. For example, the capacitor 432 is a regular linear dielectric capacitor (e.g., non-ferroelectric). Using a non-ferroelectric capacitor as the capacitor 432 (output capacitor) mitigates metastability issues.

The flip-flop 440 includes an additional stage that is used to capture the instantaneous voltage in a linear capacitor, the capacitor 443. The capacitor 443 is a non-ferroelectric capacitor, or a regular linear dielectric capacitor. The flip-flop 444 has an increased circuit area area and timing overhead as compared to the flip-flop 430. In one example, a data lose occurs within the flip-flop 430 based on a disruption in the power supply as data is held in the capacitor 431, which is realized with a ferroelectric capacitor.

In one example, if a restore is to be initiated, reboot mechanisms may be used to propagate the stored value in a flip-flop to the output pin Q of the flip-flop to a fully restore state. The restore is initiated via memory controller circuitry (e.g., the memory controller circuitry 304 of FIG. 3). Typically, the read delta voltage (the output voltage from a flip-flop) is a percentage of the power supply voltage (e.g., VDD). The lower the input node capacitance compared to that of the ferroelectric capacitor, the closer the transferred voltage is to the power supply voltage (e.g., VDD). In one example, the ferroelectric capacitor charge is the base plate capacitance in a flip-flop of a register of a memory device. In one example, ferroelectric capacitor charge corresponds to a charge of the capacitor 412 of the flip-flop 410 or the capacitor 422 of the flip-flop 420. In one example, the ferroelectric capacitor charge may instead be a non-ferroelectric capacitor charge, which corresponds to the capacitor 432 of the flip-flop 430 or the capacitor 443 of the flip-flop 440. In one example, delta $V=C_0/(C_0+C_{clk})$. Capacitance C0 is the capacitance of the capacitor 411, the capacitor 421, the capacitor 431, or the capacitor 441. In one or more examples, $C_{clk}$ is the capacitance of the clock signal CLK that can be minimal since it is a short segment compared to long bitlines in the corresponding memory arrays.

Figure 5:
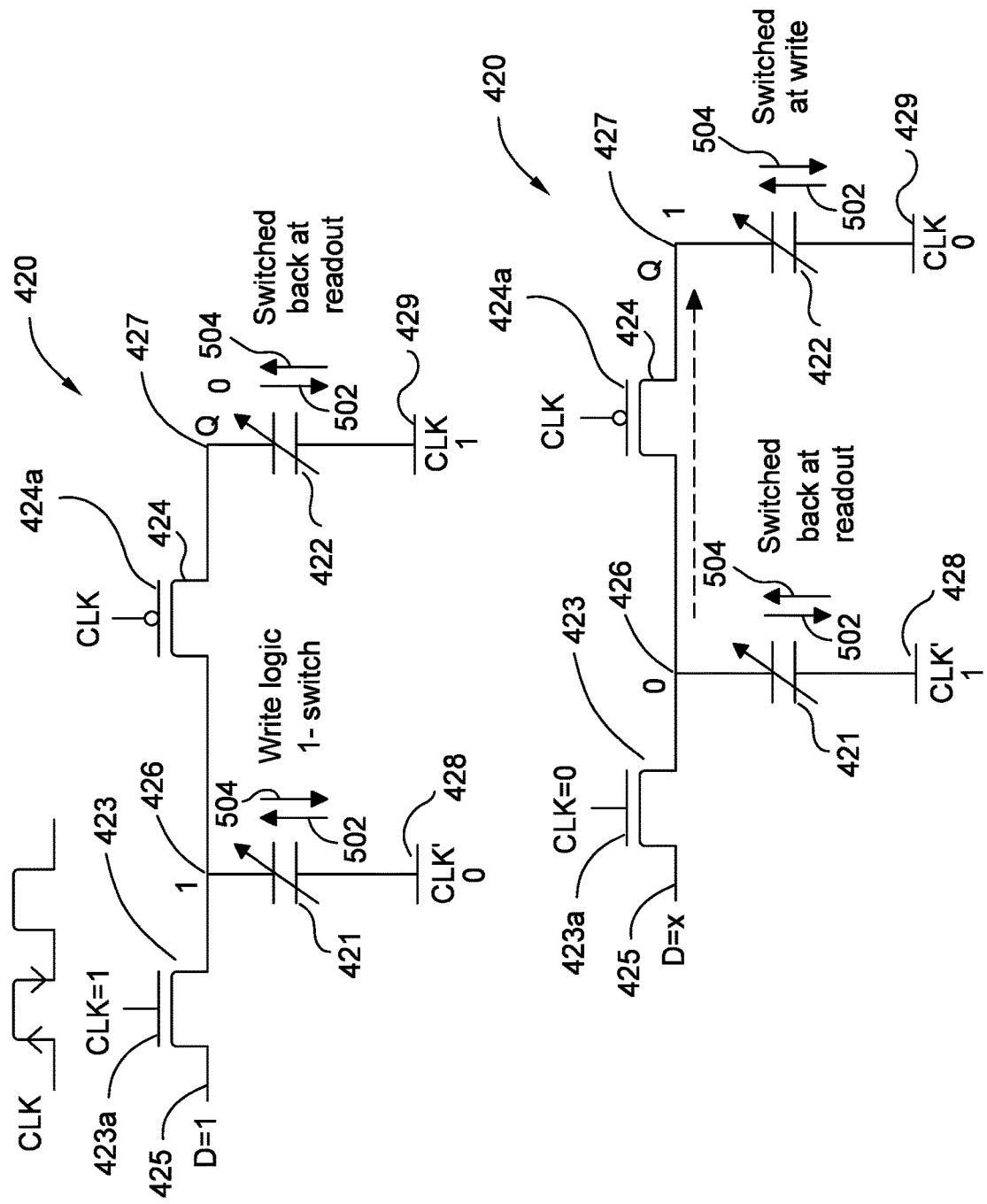
FIG. 5 illustrates an example operation of the flip-flop of FIG. 4B, according to some examples.

In one or more examples, memory controller circuitry (e.g., the memory controller circuitry 304 of FIG. 3) drives a voltage onto an input node of a flip-flop of a register (e.g., the register 308 of FIG. 3) via one or more control lines to write a logic value of 0 or 1 (or another logic value) to the flip-flop. Further, the memory controller circuitry receives a voltage from the output node of the flip-flop to read a value stored in the flip-flop. An example of writing a logic value of 1 to the flip-flop 420 is shown in FIG. 5. Arrows 502 indicate the original electric polarization direction within the capacitors 421 and 422, and arrows 504 indicate a change in polarization direction in the capacitors 421 and 422.

In FIG. 5 at a positive edge of the clock signal CLK and in a write stage, if the value of D is a logic 1, the electric polarity on capacitor 421 is positive, and if the value of D is a logic 0, the electric polarity on capacitor 422 is negative. Further, the output of the flip-flop 420 is a current pulse or voltage signal if a logic value of 1 is stored in the capacitor 421 and, if a logic value of 0 is stored in the capacitor 422, no current pulse or voltage signal is output via the node 427.

At a negative edge of the clock signal CLK, the capacitor 421 is unpolarized for the next write cycle, and the value of the capacitor 421 is written on the capacitor 422. For example, if a logic value of 1 is stored on the capacitor 421, a positive voltage is generated at the node 427 and the capacitor 422 is polarized. No current pulse is generated if a logic value of 0 is stored on the capacitor 421.

Figure 6:
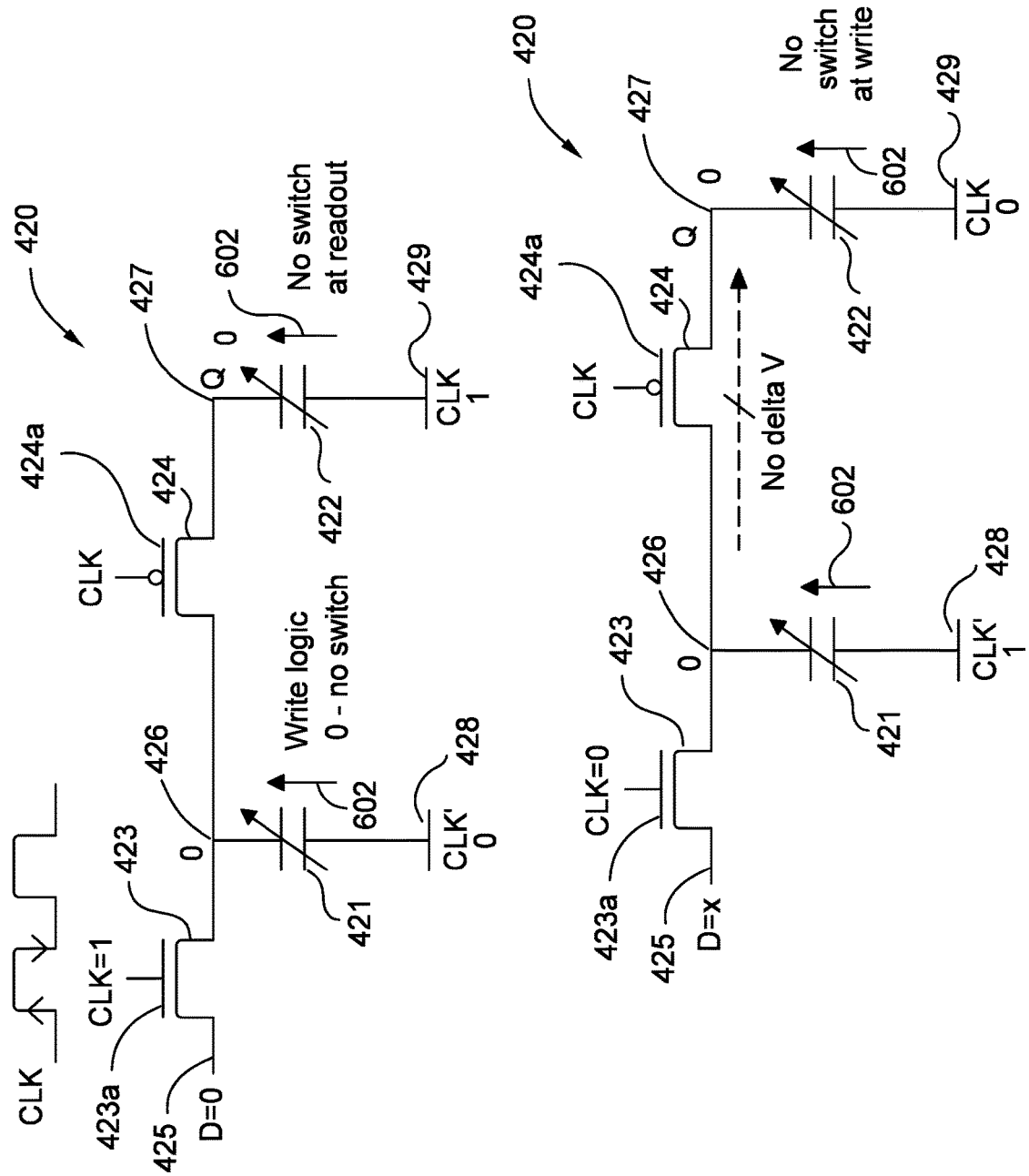
FIG. 6 illustrates an example operation of the flip-flop of FIG. 4B, according to some examples.

An example of the flip-flop 420 for writing a logic value of 0 is shown in FIG. 6. Arrows 602 indicate the electric polarization direction. In one example, if the value at the node 426 (input node) is a logic value of 1, at a positive edge of the clock signal CLK, the capacitor 421 is driven with a positive electric polarity. If the value at the node 425 (input node) is a logic value of 0, at a positive edge of the clock signal CLK, the capacitor 421 is driven with a negative electric polarity. Further, at a positive edge of the clock signal, if a logic value of 1 is stored on the capacitor 422, a current pulse or voltage signal is output via the node 427. If at a positive edge of the clock signal CLK, a logic value of 0 is stored on the capacitor 422, no current or voltage signal is output via the node 427.

At a negative edge of the clock signal CLK, the capacitor 421 is unpolarized for the next write, and if a logic value of 1 is stored in the capacitor 421, the capacitor 421 is charged based on the voltage on the capacitor 421

Figure 7:
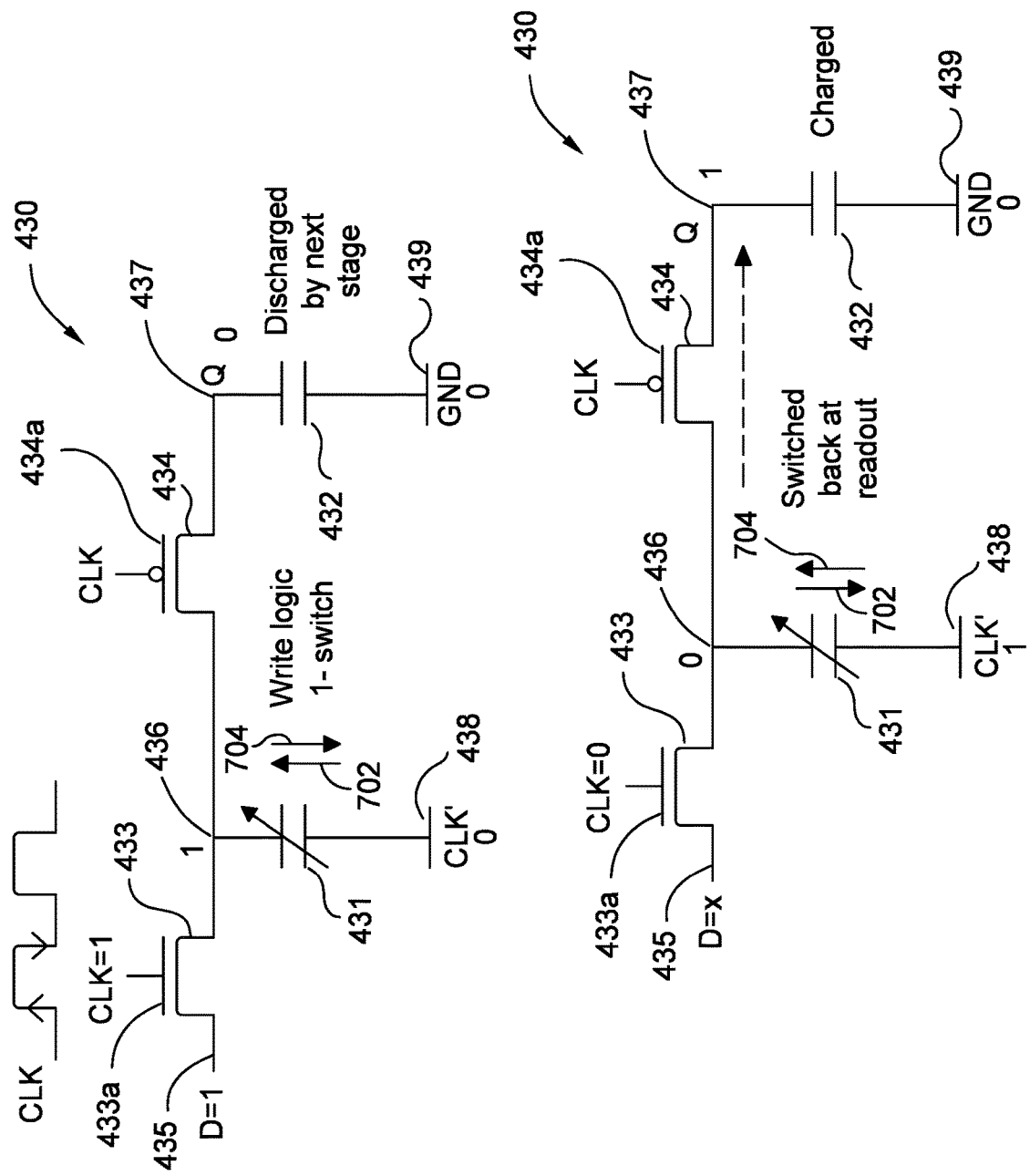
FIG. 7 illustrates an example operation of the flip-flop of FIG. 4C, according to some examples.

FIG. 7 illustrates an example of writing a logic value of 1 to the flip-flop 430 via memory controller circuitry (e.g., the memory controller circuitry 304 of FIG. 3). The capacitor 432 is a linear dielectric (non-ferroelectric) capacitor. Arrows 702 indicate an original electric polarization direction, and arrows 704 indicate a change in polarization direction. The flip-flop 430 of FIG. 4C functions similar to the flip-flop 420 as described above with regard to FIG. 5.

Figure 8:
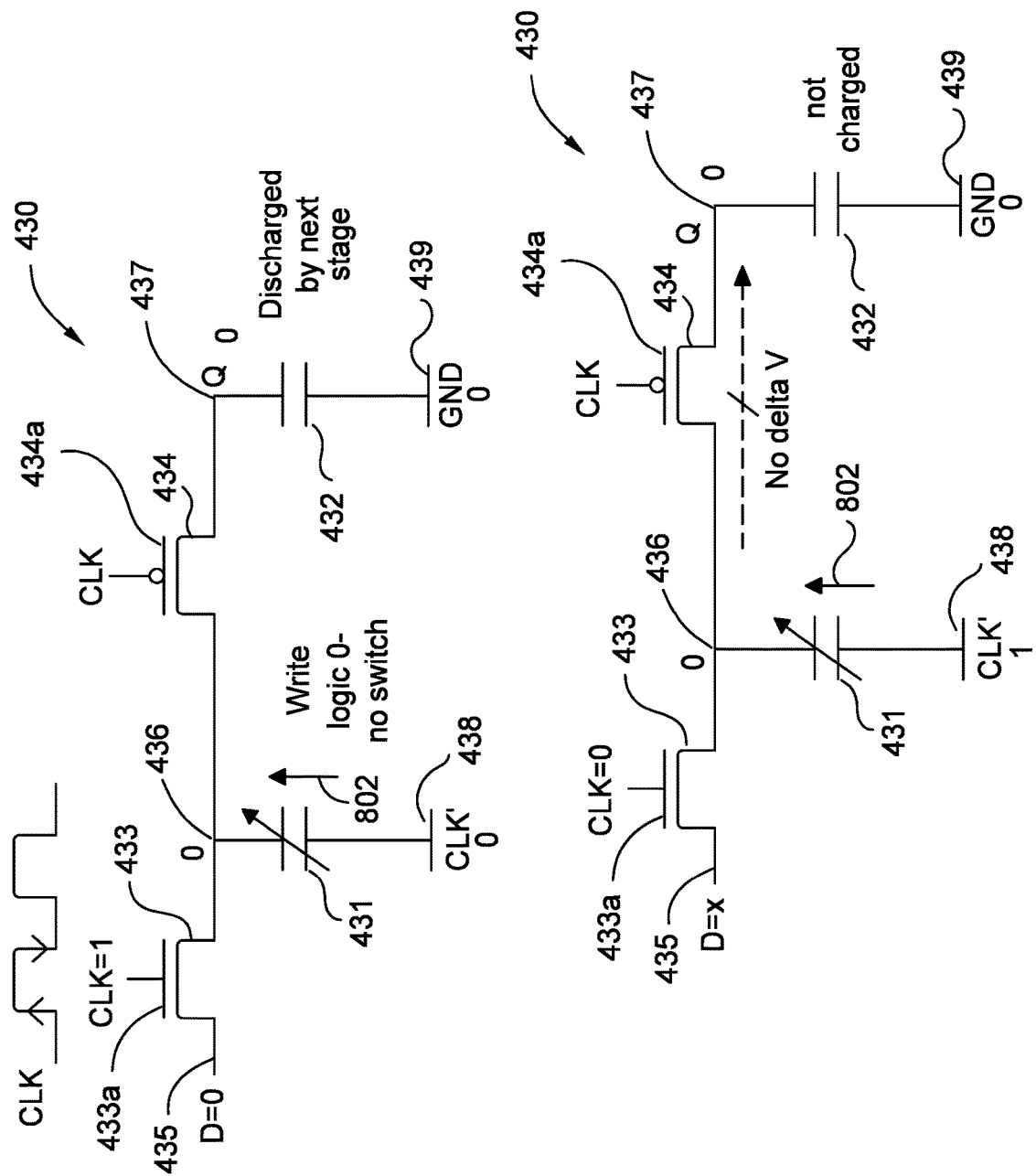
FIG. 8 illustrates an example operation of the flip-flop of FIG. 4C, according to some examples.

FIG. 8 illustrates an example of writing a logic value of 0 to the flip-flop 430 via memory controller circuitry (e.g., the memory controller circuitry 304 of FIG. 3). The capacitor 432 is a linear dielectric (non-ferroelectric) capacitor. Arrows 802 indicate an electric polarization direction. The flip-flop 430 functions similar to the flip-flop 420, as described above with reference to FIG. 6.

With reference to FIG. 7 and FIG. 8, when writing to the capacitor 431, the corresponding control line is asserted based on a rising edge of the clock signal CLK. If the logic value of the node 435 is 1, the electric polarity of the capacitor 431 is positive. If the logic value of the node 435 is 0, the electric polarity of the capacitor 431 is negative. When reading out from the capacitor 432, based on ar sign in edge of the clock signal CLK, if a logic value of 1 is stored in the capacitor 431, a current pulse or voltage is output via the node 436. If a logic value of 0 is stored in the capacitor 431, no current pulse or voltage is output via the node 436.

On a falling edge of the clock signal CLK and the control line being deasserted, the lead stage (e.g., the transmission gate 433 and the capacitor 431 are disconnected). The capacitor 431 is unpolarized for the next write period. Further, if a logic value of 1 is stored in the capacitor 431, a current pulse or voltage is output via the node 437, charging the capacitor 432. If a logic value of 0 is stored in the capacitor 431, no current pulse or voltage is output via the node 437, and the capacitor 432 is not charged.

The flip-flops 410-440 as described herein can be realized in different circuit topologies that include a ferroelectric capacitor. The flip-flops 410-440 as described herein are non-volatile, robust (endurance), logic compatible, reasoble low voltage compared to other non-volatile memories (NVMs), and can be realized in smaller area compared to registers that include more logic transistors. Further, the flip-flops 410-440 as described herein have low leakage and have robust soft-error tolerance as the data is not stored with charge based technologies but stored with electric polarization which generally cannot be disturbed by alpha particles and other radiations. Further, the flip-flops 410-440 as described herein allow for robust systems especially in devices were power supply may be intermittent.

While the foregoing is directed to specific examples, other and further examples may be devised without departing from the basic scope thereof, and the scope thereof is determined by the claims that follow.

What is claimed is:

1. A memory circuitry comprising:
  a first transmission gate comprising a first transistor connected between a first node and a second node, the first transistor having a gate terminal connected to a first clock node, the first clock node configured to receive a first clock signal;
  a first capacitor connected between the second node and a first voltage node, the first capacitor is a ferroelectric capacitor, wherein the first voltage node is configured to receive a second clock signal;
  a second transmission gate comprising a second transistor connected between the second node and a third node, the second transistor having a gate terminal connected to the first clock node; and
  a second capacitor connected between the third node and a second voltage node.

2. The memory circuitry of claim 1, wherein the second capacitor is a ferroelectric capacitor.

3. The memory circuitry of claim 1, wherein the second voltage node is configured to receive one of the first clock signal and a reference voltage.

4. The memory circuitry of claim 1, wherein:
  the first transmission gate further comprises a third transistor connected between the first node and the second node, in parallel with the first transistor, and having a gate terminal connected to a second clock node, the second clock node configured to receive a second clock signal; and
  the second transmission gate further comprises a fourth transistor connected between the second node and the third node, in parallel with the second transistor and having a gate terminal connected to the second clock node.

5. The memory circuitry of claim 4 further comprising:
  third transmission gate coupled between the third node and a fourth node; and
  a third capacitor connected between the fourth node and a third voltage node, the third capacitor is a regular linear dielectric capacitor.

6. The memory circuitry of claim 5, wherein the third transmission gate comprises:
  a fifth transistor connected between the third node and the fourth node, and having a gate terminal connected to the first clock node; and
  a sixth transistor connected between the third node and the fourth node, in parallel with the fifth transistor, and having a gate terminal connected to the second clock node.

7. The memory circuitry of claim 6, wherein the second capacitor is a ferroelectric capacitor, and the third capacitor is a non-ferroelectric capacitor.

8. The memory circuitry of claim 1, wherein the first voltage node is configured to receive a second clock signal, the second clock signal being an inverted version of the first clock signal, and wherein, based on a rising edge of the first clock signal, a first voltage is stored on the first capacitor, the first voltage corresponds to a voltage at the first node.

9. The memory circuitry of claim 8, wherein the second voltage node is configured to receive the first clock signal, and wherein, based on a falling edge of the first clock signal, the first voltage is stored on the second capacitor.

10. The memory circuitry of claim 8, wherein the second voltage node is configured to receive a reference voltage signal, and wherein, based on a falling edge of the first clock signal, the first voltage is stored on the second capacitor.

11. An integrated circuit chip comprising:
  memory circuitry comprising, a plurality of registers, a first register of the plurality of registers comprising:
    a first transmission gate comprising a first transistor connected between a first node and a second node, the first transistor having a gate terminal connected to a first clock node, the first clock node configured to receive a first clock signal;
    a first capacitor connected between the second node and a first voltage node, the first capacitor is a ferroelectric capacitor, wherein the first voltage node is configured to receive a second clock signal;
    second transmission gate comprising a second transistor connected between the second node and a third node, the second transistor having a gate terminal connected to the first clock node; and
    a second capacitor connected between the third node and a second voltage node; and
  memory controller circuitry coupled to the memory circuitry and configured to at least one of drive a first signal onto the first node to update the first register and receive a second signal from the third node to read a value of the first register.

12. The integrated circuit chip of claim 11, wherein the second capacitor is a ferroelectric capacitor.

13. The integrated circuit chip of claim 11, wherein the second voltage node is configured to receive one of the first clock signal and a reference voltage.

14. The integrated circuit chip of claim 11, wherein:
  the first transmission gate further comprises a third transistor connected between the first node and the second node, in parallel with the first transistor, and having a gate terminal connected to a second clock node, the second clock node configured to receive a second clock signal; and
  the second transmission gate further comprises a fourth transistor connected between the second node and the third node, in parallel with the second transistor and having a gate terminal connected to the second clock node.

15. The integrated circuit chip of claim 14, wherein the first register further comprises:
  a third transmission gate coupled between the third node and a fourth node, the third transmission gate comprising:

a fifth transistor connected between the third node and the fourth node, and having a gate terminal connected to the first clock node; and a sixth transistor connected between the third node and the fourth node, in parallel with the fifth transistor, and having a gate terminal connected to the second clock node; and a third capacitor connected between the fourth node and a third voltage node, the third capacitor is a regular linear dielectric capacitor.

16. The integrated circuit chip of claim 11, wherein the first voltage node is configured to receive a second clock signal, the second clock signal being an inverted version of the first clock signal, and wherein, based on a rising edge of the first clock signal, a first voltage is stored on the first capacitor, the first voltage corresponds to a voltage driven by the memory controller circuitry on the first node.

17. The integrated circuit chip of claim 16, wherein the second voltage node is configured to receive the first clock signal, and wherein, based on a falling edge of the first clock signal, the first voltage is stored on the second capacitor.

18. The memory circuitry of claim 16, wherein the second voltage node is configured to receive a reference voltage signal, and wherein, based on a falling edge of the first clock signal, the first voltage is stored on the second capacitor.

19. A memory circuitry comprising:
a first transmission gate connected between a first node and a second node, and configured to receive a first clock signal;
a second transmission gate connected between the second node and a third node, and configured to receive the first clock signal;
a third transmission gate connected between the third node and a fourth node, and configured to receive the first clock signal;
a first capacitor connected between the second node and a first voltage node;
a second capacitor connected between the third node and a second voltage node; and
a third capacitor connected between the fourth node and a third voltage node.

20. The memory circuitry of claim 19, wherein the second capacitor is a ferroelectric capacitor, and the third capacitor is a non-ferroelectric capacitor.

\* \* \* \* \*